United States Patent
Hosokawa et al.

(10) Patent No.: US 7,316,763 B2
(45) Date of Patent: *Jan. 8, 2008

(54) MULTIPLE TARGET TILES WITH COMPLEMENTARY BEVELED EDGES FORMING A SLANTED GAP THEREBETWEEN

(75) Inventors: Akihiro Hosokawa, Cupertino, CA (US); Hien-Minh Huu Le, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 212 days.

This patent is subject to a terminal disclaimer.

(21) Appl. No.: 11/137,262

(22) Filed: May 24, 2005

(65) Prior Publication Data

US 2006/0266638 A1    Nov. 30, 2006

(51) Int. Cl.
*C23C 14/35* (2006.01)

(52) U.S. Cl. .............. 204/192.12; 204/298.12; 204/298.13; 204/298.19

(58) Field of Classification Search ........ 204/298.12, 204/298.13, 298.19, 192.12
See application file for complete search history.

(56) References Cited

U.S. PATENT DOCUMENTS

| 5,466,355 A | 11/1995 | Ohhashi et al. | 204/298.13 |
|---|---|---|---|
| 6,267,851 B1 | 7/2001 | Hosokawa | 204/192.12 |

FOREIGN PATENT DOCUMENTS

| DE | 19622606 | | 12/1997 |
|---|---|---|---|
| JP | 63-100177 | * | 5/1988 |
| JP | 63-192863 | * | 8/1988 |
| JP | 01-230768 | * | 9/1989 |
| JP | 01-230798 | | 9/1989 |
| JP | 09-287072 | * | 11/1997 |
| JP | 10-121232 | * | 5/1998 |
| JP | 63-143258 | * | 6/1998 |
| JP | 2003-027227 | | 1/2003 |
| JP | P2005-105389 | | 4/2005 |
| JP | P2005-105389 A | | 4/2005 |

OTHER PUBLICATIONS

Machine Translation of 09-287072 & 10-121232.*
Machine Translation of 09-287072 dated Nov. 1997.*
Machine Translation of 10-121232 dated Apr. 1998.*

* cited by examiner

*Primary Examiner*—Rodney G. McDonald
(74) *Attorney, Agent, or Firm*—Charles S. Guenzer

(57) ABSTRACT

A target assembly composed of multiple target tiles bonded in an array to a backing plate of another material. The edges of the tile within the interior of the array are formed with complementary beveled edges to form slanted gaps between the tiles. The gaps may slant at an angle of between 10° and 55°, preferably 15° and 45°, with respect to the target normal. The facing sides of tiles may be roughened by bead blasting, for both perpendicular and sloping gaps. The area of the backing plate underlying the gap may be roughened or may coated or overlain with a region of the material of the target, for both perpendicular and sloping gaps.

15 Claims, 2 Drawing Sheets

US 7,316,763 B2

MULTIPLE TARGET TILES WITH COMPLEMENTARY BEVELED EDGES FORMING A SLANTED GAP THEREBETWEEN

FIELD OF THE INVENTION

The invention relates generally to sputtering of materials. In particular, the invention relates to sputtering targets composed of multiple tiles.

BACKGROUND ART

Sputtering, alternatively called physical vapor deposition (PVD), is the most prevalent method of depositing layers of metals and related materials in the fabrication of semiconductor integrated circuits. Sputtering is now being applied to the fabrication of flat panel displays (FPDs) based upon thin film transistors (TFTs). FPDs are typically fabricated on thin rectangular sheets of glass. A layer of silicon is deposited on the glass panel and silicon transistors are formed in and around the silicon layer by techniques well known in the fabrication of electronic integrated circuits. The electronic circuitry formed on the glass panel is used to drive optical circuitry, such as liquid crystal displays (LCDs), organic LEDs (OLEDs), or plasma displays subsequently mounted on or formed in the glass panel. Yet other types of flat panel displays are based upon organic light emitting diodes (OLEDs).

Size constitutes one of the most apparent differences between electronic integrated circuits and flat panel displays and in the two sets of equipment used to fabricate them. Demaray et al. disclose many of the distinctive features of flat panel sputtering apparatus in U.S. Pat. No. 6,199,259, incorporated herein by reference. That equipment was originally designed for panels having a size of approximately 400 mm×600 mm. Because of the increasing sizes of flat panel displays being produced and the economy of scale realized when multiple displays are fabricated on a single glass panel and thereafter diced, the size of the panels has been continually increasing. Flat panel fabrication equipment is commercially available for sputtering onto substrates having a minimum size of 1.8 m and equipment is being contemplated for panels having sizes of 2 m×2 m and even larger, that is, substrates having an area of 40,000 cm$^2$ or larger.

For many reasons, the target for flat panel sputtering is usually formed of a sputtering layer of the target material bonded to a target backing plate, typically formed of titanium. The conventional method of bonding a target layer to a backing plate applies a bonding layer of indium to one of the two sheet-like members and presses them together at a temperature above indium's melting point of 156° C. A more recently developed method of bonding uses a conductive elastomer or other organic adhesive that can be applied at much lower temperature and typically cured at an elevated but relatively low temperature. Such elastomeric bonding services are available from Thermal Conductive Bonding, Inc. of San Jose, Calif. Demaray et al. in the aforecited patent disclose autoclave bonding.

SUMMARY OF THE INVENTION

According to one aspect of the invention, multiple target tiles are bonded to a backing plate with a slanted gap formed between complementary beveled edges of adjacent target tiles. The edges may slope at angle in range between 10° and 55°, preferably between 15° and 45° with respect to the normal of the front surfaces of the target tiles. A tile edge at the outer periphery of the array of bonded target tiles may be formed with a beveled edge slanting outwardly toward the center of the tiles.

According to another aspect of the invention, the beveled edges of the tiles may be roughened by bead blasting for example.

According to yet another aspect of the invention, the portion of the backing plate at the bottom of a gap separating two target tiles may be selectively roughened while leaving a principal part of the backing plate underlying the tiles smooth and in contact with the tiles.

According to a further aspect of the invention, the portion of the backing plate at the bottom of the inter-tile gap may be coated with a layer of target material or a strip of target material may be laid on the bottom prior to tile bonding.

DETAILED DESCRIPTION OF THE PREFERRED EMBODIMENTS

Figure 1:
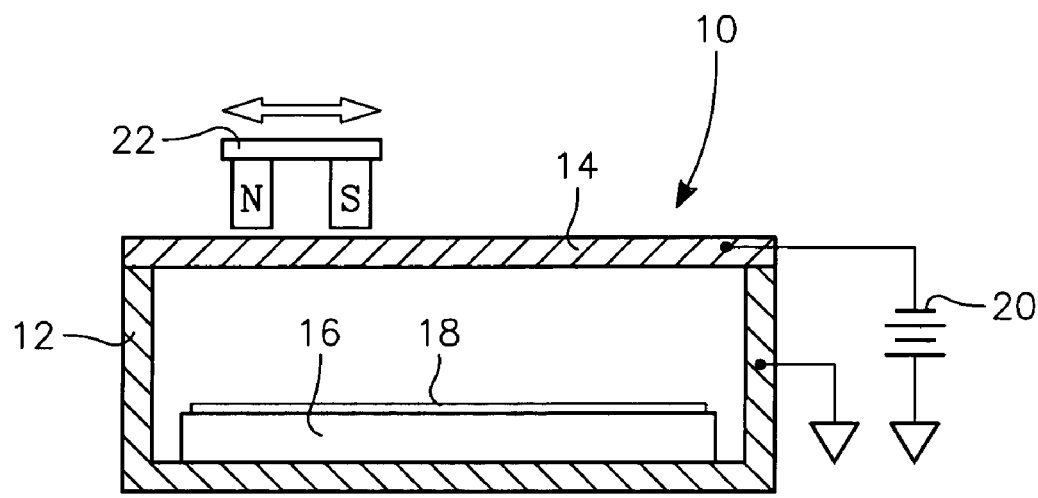
FIG. 1 is a schematic cross-sectional view of a conventional plasma sputter reactor adapted for sputter deposition onto rectangular substrates.

A sputtering chamber 10, schematically illustrated in the cross-sectional view of FIG. 1, includes a vacuum chamber 12, a target 14 sealed to but isolated from the electrically grounded chamber 12, and a pedestal 16 supporting a panel 18 to be sputter coated. The target 14 includes a surface layer of the material to be sputtered onto the panel 18. An argon working gas is admitted into the chamber with a pressure in the milliTorr range. A power supply 20 electrically biases the target 14 to a negative voltage of a few hundred volts, causing the argon gas to discharge into a plasma. The positive argon ions are attracted to the negatively biased target 14 and sputter target atoms from it. In many applications, a magnetron 22 is scanned over the back of the target to intensify the plasma and increase the sputtering rate. Some of the target atoms strike the panel 18 and form a thin film of the target atoms on its surface. The target 14 is often somewhat larger than the panel 18 being sputter coated. Sputtering for flat panels has utilized a large number of target materials including aluminum, copper, titanium, tantalum, molybdenum, chromium, and indium tin oxide (ITO) as well as other materials.

One problem arising from the increased panel sizes and hence increased target sizes is the difficulty of obtaining target material of proper quality in the larger sizes. Refractory materials such as chromium are particularly difficult materials. The size problem has been addressed by forming the target sputtering layer from multiple target tiles. As schematically illustrated in the plan view of FIG. 2, multiple target tiles 22 are set on a backing plate 24 with a predetermined gap 26 between them. The tiles 22 are thereafter bonded to the backing plate 24. The large peripheral area of the backing plate 24 outside the tiles 22 is used to support the target 14 on the vacuum chamber 12 and one or more extensions 28 of the backing plate 24 extend outside of the outline of the vacuum chamber 12 to provide plumbing ports for the water cooling channels formed in the backing plate 24 and electrical connect to the bias source.

Figure 2:
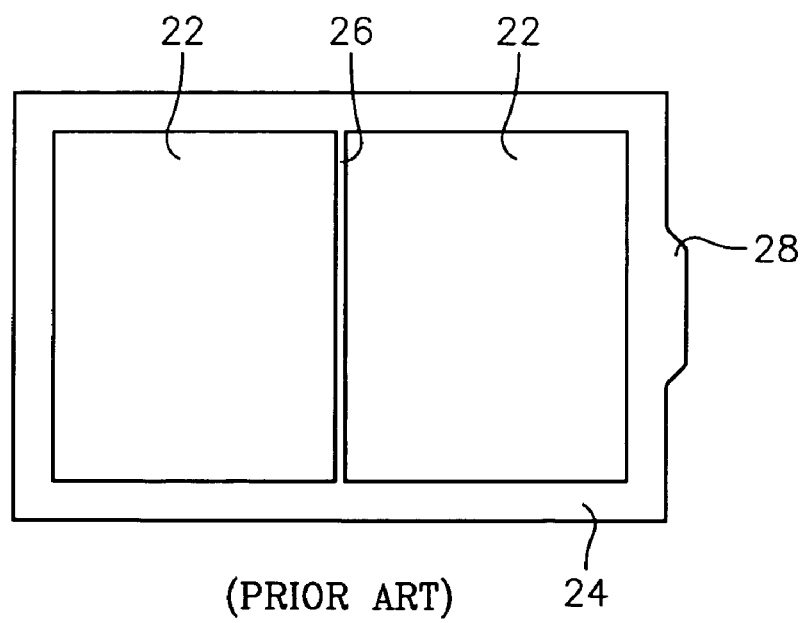
FIG. 2 is a plan view of conventional sputtering target composed of multiple target tiles bonded to a backing plate.

The arrangement of two tiles illustrated in FIG. 2 represents the simplest tile arrangement, two tiles 22 in a linear array with a single gap 26 between them. Demaray in the aforecited patent discloses a larger number N>2 of tiles in a linear array with (N−1) gaps between them. Tepman in U.S. patent application Ser. No. 10/888,383, filed Jul. 9, 2004, discloses a two-dimensional array of tiles with vertical and horizontally extending gaps intersecting each other. The array may be a rectangular array, a staggered array as in simple brick wall, or more complicated two-dimensional arrays including herringbone patterns. Although rectangular tiles present the simplest geometry, other tile shapes are possible, such as triangular and hexagonal tile shapes with correspondingly more complex gap arrangements.

The gap 26 between tiles must be carefully designed and maintained. Typically, the gap is not filled with other material and conventionally the adhesive or material other than the target material is exposed at the bottom of the gap 26. However, if the gap (or at least part of it) is maintained at less than about 0.5 to 1.0 mm, then the sputtering plasma cannot propagate into the gap because the gap is less than the plasma dark space. With no plasma propagating to the bottom of the gap, the backing plate is not sputtered. However, there is a tendency for the material sputtered from the target tiles to be redeposited on the target tiles. Usually this is not a problem because the redeposited material is again sputtered at a rate faster than it is being deposited, thereby avoiding the problem of a thick layer accumulating composed of redeposited material of less than optimal quality. That is, the tile surfaces are kept clean. However, the sputtered material is also redeposited into the gaps between the tiles although at a reduced rate because of the geometry. However, since the plasma does not extend significantly into the gap in a well operated target, the resputtered material is not again sputtered at a rate as high as on the planar surface of the tiles. That is, the redeposited material tends to accumulate to a significant thickness on the sides and bottom of the gap. Redeposited material tends to peel and flake if allowed to accumulate to a substantial thickness. The flaking material is a particle which, if it falls on the panel or other substrate being sputter coated, is likely to cause a defect in the electronic circuitry being developed in the panel. One method of reducing the redeposition and resultant flaking is to reduce the width of the gap, for example, to between 0.3 and 0.5 mm. Attempts to further reduce the gap to 0.1 mm introduce operational difficulties encountered in fabricating the target assembly and in maintaining the gap during temperature cycling.

Figure 3:
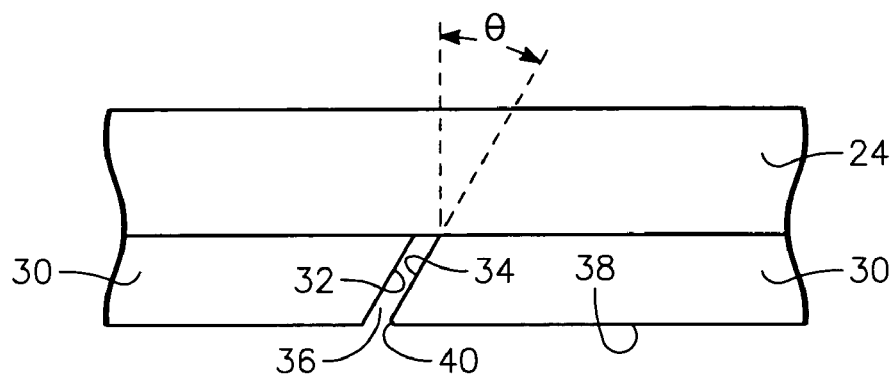
FIG. 3 is a cross-sectional view of a portion of a sputter target of the invention including two target tiles separated by a slanted gap.

One embodiment of the invention is illustrated in the cross-sectional view of FIG. 3, target tiles 30 are bonded to the backing plate 24 of typically a different material, often titanium. The bonding of the tiles 30 to may be achieved, for example, by a thin layer of adhesive. The backing plate 24 is sometimes formed of multiple layers to include cooling channels to keep the target cool during sputter operation. However, in other applications, the backing plate is an integral member cooled by other means.

According to one aspect of the invention, adjacent tiles 30 are slanted at complementary angles on opposed sides 32, 34 separated by a slanted gap 36 that is inclined with respect to the normal of front faces 38 of the tiles 30, for example at an angle θ of between 10° and 55°, preferably between 15° and 45° from the normal of the front faces 38 of the tiles 30. The thickness of the gap 36 in the direction perpendicular to the slanting sides 32, 34 may be maintained at 0.3 to 0.5 mm.

The slanting provides at least two benefits. Any redeposited material that flakes from sides 32, 34 of the slanted gap 36 is either already on a lower tile surface 34 and gravity tends to hold the flakes there or the flakes fall from an upper tile surface 32 towards the lower tile surface 32, which tends to hold them there. The latter mechanism, however, does not apply to a narrow region near the front surface 38. Furthermore, the total length of the gap 36 between the principal sputtering surface 38 of the tiles 30 and the backing plate 24 is increased. Thereby, the plasma is kept further away from the backing plate 24. Other angles enjoy benefits of the invention. However, a lesser angle θ reduces both beneficial results described above and a greater angle θ is somewhat more difficult to work with because of substantial overlap and acute corners. The acute corners can be formed as somewhat rounded corners 40, but rounding detracts from both beneficial results. A yet further beneficial effect is that while the slanted gap thickness may be maintained at 0.3 to 0.5 mm with full effect on the plasma dark space, the gap thickness along the direction of the planar faces is greater by a factor of the co-tangent of θ, thus easing assembly and movement problems.

Advantageously, according to another aspect of the invention, the opposed sides 32, 34 of the tiles 30 are bead blasted or otherwise roughened, preferably prior to bonding. As a result, any sputter material redeposited on the opposed sides 32, 34 adheres better to the sides of the tiles 30 to reduce or delay the flaking. The bead blasting may be performed by entraining hard particles, for example, of silica or silicon carbide, in a high pressure gas flow directed at the tile to roughen its surface, for example, to a roughness of 300 to 500 microinches.

Figure 4:
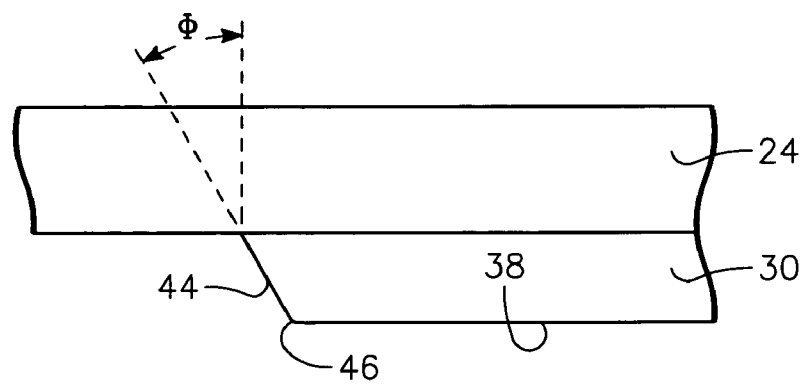
FIG. 4 is a cross-sectional view of a beveled peripheral portion of a target tile.

On the other hand, the peripheral edges of the tiles 30, that is, the edges not facing another tile 30 across a gap 36, are preferably tapered as illustrated in the cross-sectional view of FIG. 4 to form a sidewall 44 that tapers inwardly away from the backing plate 24 at an angle φ before joining the front face 40 of the tile 30 through a with a curved corner 46. The angle φ may be in a range of 10° to 55°, preferably near 15°. In use, the slanting sidewall 44 is spaced from a similarly shaped dark-space shield attached to the chamber by a small gap that prevents the plasma from propagating to the uncovered backing plate 24.

Preferably, the sidewall 44 is bead blasted, prior to bonding to the backing plate 24, to promote adhesion of redeposited material. Thereby, what material is redeposited on the tapered sidewall 44 is more solidly attached to it to thereby reduce flaking of the redeposited material and the resultant particulates.

Figure 5:
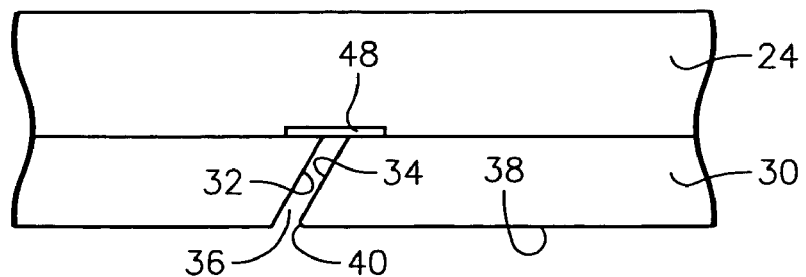
FIG. 5 is a cross-sectional view of a portion of a sputter target of the invention including either a roughened portion of the backing plate or a region of target material coated or laid on a area of the backing plate at the bottom of the gap between two tiles. The figure also shows roughening of the two beveled edges of the target tiles.

In another aspect of the invention, as illustrated in the cross-sectional view of FIG. 5, the slanting side walls 32, 34 of the tiles 30 facing the slanting gap 36 are bead blasted, prior to bonding to the backing plate 24, to have a roughened surface to provide better adhesion for whatever material is redeposited in the slanting gap 36. In a related aspect of the invention, the backing plate 24 is bead blasted prior to tile bonding in a region 48 over which the gap 36 will develop after tile bonding. Contrary to the illustration, the bead blasting forms a roughened surface with some sub-surface damage confined very close to the surface. The roughening of the tile edges adjacent the gap is applicable to perpendicular as well as to slanted tiles edges and gaps. Preferably, the majority of the area of the backing plate 24 facing the tiles 30 is left substantially smoother than the roughened region 44 SO that the tiles 30 can be bonded more intimately with the backing plate 24 if a surface adhesive layer is used or be directly contacting the smooth area of the backing plate 24 if the adhesive is filled into recesses in the backing plate 24.

In a yet further aspect of the invention, prior to bonding of the tiles 30 to the backing plate 24, target material is deposited in the region 48 over which the gap 36 will develop after tile bonding. A strip of target material may be bonded to the backing plate 24 to form the region 48. The thickness of the strips may be in a range between 1 and 4 mm. It may be adhesively bonded to the target, for example, with a polymer adhesive or Kapton tape. The strip may be very thin and extend a very short distance above the surface of the backing plate, as is not accurately illustrated in FIG. 5. In an alternative embodiment, the region 48 is machined as a recess into the backing plate 24 and target material is selectively deposited into the recess. Thereby, if some sputtering does occur at the bottom (top as illustrated). of the gap 36, for example, during arcing or plasma striking, target material of the region 48 rather than material of the backing plate 24 is sputtered. This feature is useful for perpendicular as well as slanted gaps. The additional target material 48 beneath the gap 36 or bead blasting of the backing plate 24 is particularly advantageous when the adhesive bonding the tiles 30 to the backing plate 24 is patterned and does not extend in the area of the gap 36. That is, adhesive is not exposed at the bottom of the gap 36. Instead, either the roughened region 44 of the backing plate or the region 44 of the target material is exposed. The roughening of the backing plate 24 or the target material deposited or laid on the backing plate 24 at the bottom of the gap 36 is applicable to perpendicular as well as slanted gaps.

The aspect of the invention involving complementary beveled tile edges is applicable to sputtering in virtually any application in which the target includes multiple target tiles mounted on a backing plate, for example, for sputtering onto solar cell panels. It can be applied as well to sputtering onto circular wafers in which a generally circular target is composed of multiple tiles, for example, of segmented shape or arc shape surrounding a circular center tile. The invention can be applied to cluster tool systems, in-line systems, stand-alone systems or other systems requiring one or more sputter reactors.

Thus the invention can reduce the production of particulates and of extraneous sputtered material with little increase in cost and complexity of the target, particularly, a multi-tile target.

The invention claimed is:

1. A target assembly, comprising:
   a backing plate; and
   a plurality of target tiles bonded to the backing plate with complementary beveled edges to form one or more slanted gaps between said tiles, wherein one or more inter-tile areas of said backing plate underlying said one or more gaps are selectively roughened and is exposed to said one or more gaps.

2. The target assembly of claim 1, wherein said one or more slanted gaps are inclined with respect to normals of principal surfaces of said tiles at an angle within a range between 10° and 55°.

3. The target assembly of claim 1, wherein said beveled edges are roughened.

4. The target assembly of claim 1, wherein a majority of the area of the backing plate facing the tiles is smoother than the inter-tile areas.

5. A target assembly, comprising:
   a backing plate;
   target tiles bonded to the backing plate with facing edges thereof forming one or more gaps between said tiles, wherein one or more inter-tile areas of said backing plate facing said gaps are selectively roughened to be rougher than other areas of said backing plate facing the tiles.

6. The target assembly of claim 5, wherein said one or more gaps are perpendicular to principal surfaces of said tiles.

7. The target assembly of claim 5, wherein said one or more gaps are inclined with respect to normals of principal surfaces of said tiles at an angle within a range of 15° and 45°.

8. The target assembly of claim 5, wherein a majority of the area of the backing plate facing the tiles is smoother than the inter-tile areas.

9. A method of sputtering, comprising the steps of:
   providing a plasma sputter reactor including a support;
   mounting on said reactor in opposition to said support a target comprising a plurality of target tiles comprising a material to be sputtered, wherein opposing edges of said target tiles of adjacent ones of said target tiles are sloped at complementary angles to formed at least one slanted gap therebetween and wherein one or more inter-tile areas of said backing plate underlying said at least one slanted gap are selectively roughened and exposed to the at least one gap;
   placing a substrate on said support; and
   exciting a plasma in said sputter reactor to sputter said material from said target tiles onto said substrate.

10. The method of claim 9, wherein said slanted gap is inclined with respect to normals of principal surfaces of said tiles at an angle within a range of 10° and 55°.

11. A product formed in said substrate according to the method of claim 9.

12. The method of claim 9, wherein a majority of the area of the backing plate facing the tiles is smoother than the inter-tile areas.

13. A target assembly, comprising:
   a backing plate; and
   a plurality of target tiles bonded to the backing plate to form one or more gaps between edges of the tiles, wherein one or more inter-tile areas of said backing plate underlying said one or more gaps is selectively roughened and a majority of an area of the backing plate facing the tiles is smoother than the inter-tile area.

14. The target assembly of claim 13, wherein said gaps are slanted gaps.

15. The target assembly of claim 14, wherein the slanted gaps are inclined with respect to normals of principal surfaces of said tiles at an angle within a range between 10° and 55°.

* * * * *